United States Patent
Yoshikawa et al.

(10) Patent No.: US 7,179,417 B2
(45) Date of Patent: Feb. 20, 2007

(54) SN—ZN LEAD-FREE SOLDER ALLOY, ITS MIXTURE, AND SOLDERED BOND

(75) Inventors: Masaaki Yoshikawa, Sagamihara (JP); Haruo Aoyama, Sagamihara (JP); Hirotaka Tanaka, Sagamihara (JP)

(73) Assignee: Nippon Metal Industry Co., Ltd., Tokyo (JP)

(*) Notice: Subject to any disclaimer, the term of this patent is extended or adjusted under 35 U.S.C. 154(b) by 0 days.

(21) Appl. No.: 11/435,614

(22) Filed: May 17, 2006

(65) Prior Publication Data
US 2006/0210420 A1    Sep. 21, 2006

Related U.S. Application Data

(62) Division of application No. 10/468,607, filed as application No. PCT/JP02/11990 on Nov. 18, 2002.

(30) Foreign Application Priority Data
Aug. 23, 2002   (JP) .............................. 2002-242785

(51) Int. Cl.
B23K 35/14    (2006.01)
B23K 35/26    (2006.01)
(52) U.S. Cl. ...................... 420/560; 420/561; 420/562; 148/400
(58) Field of Classification Search ........ 420/560–562; 148/400
See application file for complete search history.

(56) References Cited

U.S. PATENT DOCUMENTS
6,080,497 A * 6/2000 Carey et al. ............... 428/647

FOREIGN PATENT DOCUMENTS

| JP | 2000-15478 | | 1/2000 |
| JP | 2000015478 | * | 1/2000 |
| JP | 2000-210788 | | 8/2000 |
| JP | 2002-248596 | | 9/2002 |
| JP | 2002-283093 | | 10/2002 |

* cited by examiner

Primary Examiner—Sikyin Ip
(74) Attorney, Agent, or Firm—Jordan and Hamburg LLP

(57) ABSTRACT

An Sn—Zn lead-free solder alloy according to the present invention is constructed in a manner such that it is an Sn-based solder alloy indispensably containing 6 to 10 wt % zinc at least, and further containing 0.0015 to 0.1 wt % magnesium, said magnesium content being effective quantity for forming a protective magnesium oxide film on the solder surface and also for destroying said oxide film during soldering. When solder paste is preserved, the inside of solder particle is protected by the protective magnesium oxide film formed on the surface of solder particle, and a reaction between zinc and an activator is suppressed, so that preservation stability is improved, and at elevated temperature during soldering, a state where said protective oxide film is easily destroyed is obtained, so that good wettability is held.

5 Claims, 1 Drawing Sheet

| SAMPLES | CHEMICAL COMPOSITIONS OF PARTICLE | | | | | PRESERVATION STABILITY | SOLDERABILITY | | | REMARKS |
|---|---|---|---|---|---|---|---|---|---|---|
| | Sn % | Zn % | Bi % | Mg ppm | Al ppm | | ONE DAY LATER | ONE WEEK LATER | UNMELTED SOLDER | |
| A | 91 | 8 | 1 | 15 | — | ○ | ○ | ○ | ◎ | |
| B | 91 | 9 | | 71 | — | ◎ | ○ | ○ | ◎ | |
| C | 89 | 8 | 3 | 141 | — | ◎ | ◎ | ○ | ◎ | |
| D | 92 | 7 | 1 | 89 | — | ◎ | ○ | ○ | ◎ | EXAMPLES OF THE INVENTION |
| E | 93 | 6 | 1 | 188 | — | ◎ | ◎ | ◎ | ◎ | |
| F | 91 | 8 | 1 | 243 | — | ◎ | ◎ | ◎ | ◎ | |
| G | 91 | 8 | 1 | 336 | — | ◎ | ◎ | ◎ | ◎ | |
| H | 91 | 8 | 1 | 432 | — | ○ | ◎ | ◎ | ○ | |
| I | 91 | 8 | 1 | 533 | — | ○ | ◎ | ◎ | ○ | |
| J | 89 | 8 | 3 | 2 | — | × | × | × | ◎ | |
| K | 91 | 8 | 1 | 5 | — | × | × | × | ◎ | |
| L | 91 | 9 | | 1 | — | × | × | × | ◎ | COMPARISON EXAMPLES |
| M | 91 | 8 | 1 | 1090 | — | × | × | × | × | |
| N | 89 | 8 | 3 | — | 29 | × | ○ | ○ | ◎ | |
| O | 91 | 8 | 1 | — | 126 | ◎ | ◎ | ◎ | × | |
| P | 91 | 9 | | — | 240 | ◎ | × | × | × | |

FIG. 1

| SAMPLES | CHEMICAL COMPOSITIONS OF PARTICLE | | | | | PRESERVATION STABILITY | SOLDERABILITY | | | REMARKS |
|---|---|---|---|---|---|---|---|---|---|---|
| | Sn % | Zn % | Bi % | Mg ppm | Al ppm | | ONE DAY LATER | ONE WEEK LATER | UNMELTED SOLDER | |
| A | 91 | 8 | 1 | 15 | — | ○ | ○ | ○ | ◎ | EXAMPLES OF THE INVENTION |
| B | 91 | 9 | — | 71 | — | ◎ | ○ | ○ | ◎ | |
| C | 89 | 8 | 3 | 141 | — | ◎ | ◎ | ○ | ◎ | |
| D | 92 | 7 | 1 | 89 | — | ◎ | ○ | ○ | ◎ | |
| E | 93 | 6 | 1 | 188 | — | ◎ | ◎ | ◎ | ◎ | |
| F | 91 | 8 | 1 | 243 | — | ◎ | ◎ | ◎ | ◎ | |
| G | 91 | 8 | 1 | 336 | — | ◎ | ◎ | ◎ | ◎ | |
| H | 91 | 8 | 1 | 432 | — | ○ | ◎ | ◎ | ○ | |
| I | 91 | 8 | 1 | 533 | — | ○ | ◎ | ◎ | ○ | |
| J | 89 | 8 | 3 | 2 | — | × | × | × | ◎ | COMPARISON EXAMPLES |
| K | 91 | 8 | 1 | 5 | — | × | × | × | ◎ | |
| L | 91 | 9 | — | 1 | — | × | × | × | ◎ | |
| M | 91 | 8 | 1 | 1090 | — | × | × | × | × | |
| N | 89 | 8 | 3 | — | 29 | ◎ | ◎ | ○ | ◎ | |
| O | 91 | 8 | 1 | — | 126 | ◎ | ◎ | ◎ | × | |
| P | 91 | 9 | — | — | 240 | ◎ | × | × | × | |

SN—ZN LEAD-FREE SOLDER ALLOY, ITS MIXTURE, AND SOLDERED BOND

REFERENCE TO RELATED APPLICATION

This is a divisional application of Ser. No. 10/468,607, filed Aug. 19, 2003 which is currently pending. The subject matter of the aforementioned prior application is hereby incorporated herein by reference.

TECHNICAL FIELD

The present invention relates to an Sn—Zn lead-free solder alloy, its mixture and soldered bond, which have improved environmental safety among various solder materials.

BACKGROUND ART

Hitherto, an Sn—Pb solder alloy has often been used for soldering various apparatuses because it has advantages such that a melting point is low, wettability is good even in an oxidizing atmosphere, and the like. However, since lead has toxicity, in recent years, the realization of a lead-free solder has rapidly been progressed from a viewpoint of prevention of environmental pollution in association with a disposing process or the like of electronic apparatuses. However, since a lead-free solder alloy is inferior to the conventional Sn—Pb solder alloy in terms of the wettability, melting point, costs, and the like, it is not developed yet at present as a perfect substitute.

In such a stream where importance is attached to the environment, the realization of a lead-free solder is an emergency subject also in reflow soldering as one of mounting steps of electronic circuit devices. Therefore, hitherto, an Sn—Zn solder alloy containing about 9 wt % zinc (eutectic composition) has been proposed as a lead-free solder material which is expected to be put into practical use for reflow soldering. Further, an Sn—Zn solder alloy containing about 8 wt % zinc and 1 to 3 wt % bismuth has been also proposed. Those Sn—Zn solder alloys have advantages such that a eutectic temperature of a tin-zinc alloy is equal to 199° C. closest to a eutectic point of a tin-lead alloy among Sn-based lead-free solder alloys, and costs of raw materials of them are lower than those of the other lead-free solder alloys.

Generally, solder paste which is used for the reflow soldering is made of a mixture of solder particle and flux. An activator to clean the surface of a soldering target and improve the wettability of the solder during soldering has been added to the flux. Therefore, in the Sn—Zn solder alloy which is inferior to the conventional Sn—Pb solder alloy in terms of the wettability, it cannot help enhancing the activator particularly in order to improve the wettability of the solder. Moreover, in the Sn—Zn solder alloy, zinc-riched phases exist on the surface and the inside of the manufactured solder particle.

Therefore, in the conventional Sn—Zn lead-free solder alloy, there are problems such that since zinc is an active element, while the solder paste which is made by mixing the solder powder with the flux is preserved, zinc on the surface of the solder particle easily reacts on the activator in the flux, so that viscosity of the solder paste is rapidly and remarkably increased by its reactive product more than the conventional Sn—Pb solder alloy, and when such a solder paste is used, for example, it is impossible to print onto a printed wiring board.

There is also a problem such that if an activity or an amount of the activator is suppressed in order to prevent an increase in viscosity of the solder paste, a zinc oxide which is produced during soldering cannot be reduced, so that wettability of the solder deteriorates. As mentioned above, hitherto, it is extremely difficult to reconcile the wettability and preservation stability for a long time of the solder, and that causes non-spread of the lead-free solder paste which is effective to protect the environment.

Therefore, hitherto, a method of adding another element, for example, aluminum has been disclosed as means for solving the above problem (International Publication No. WO02/34969A1). However, since the method of adding aluminum has a problem of occurrence of an unmelted solder as will be explained hereinlater, it cannot help limiting the amount of added aluminum to a narrow range in a present situation.

As mentioned above, there is an Sn—Zn solder alloy containing bismuth as conventional lead-free solder alloys. In such a kind of solder alloy, there is a tendency such metallic gloss on the surface of the solder after solidification becomes dim. Therefore, besides the reconciliation between the wettability and the preservation stability, it is also demanded to solve the problem on the external appearance.

It is, therefore, an object of the present invention to provide an Sn—Zn lead-free solder alloy, its mixture and a soldered bond using the same in which wettability of solder is improved and preservation stability for a long time of solder paste is also excellent and also to improve surface gloss after solidification in the case of an Sn—Zn solder containing bismuth.

DISCLOSURE OF INVENTION

The present inventors have made diligent studies to solve the conventional problems mentioned above, so that they have found out that if a predetermined infinitesimal quantity of magnesium whose oxidizing tendency is higher than that of zinc is added to an Sn—Zn solder, a reaction between zinc and flux in solder paste is suppressed, so preservation stability is improved and, during soldering, good wettability is held, and the present invention with the following construction has been completed.

That is, according to a first aspect of the present invention, there is provided an Sn—Zn lead-free solder alloy which is an Sn-based solder alloy indispensably containing 6 to 10 wt % zinc at least and containing 0.0015 to 0.1 wt % magnesium, said magnesium content being effective quantity for forming a protective magnesium oxide film on the surface of solder and also for destroying said oxide film during soldering. Therefore, according to the present invention, when solder paste is preserved, the inside of solder particle is protected by the protective magnesium oxide film formed on the surface of solder particle, and a reaction between zinc and an activator is suppressed, so that preservation stability is improved, on the other hand, at the elevated temperature during soldering, a state where said protective oxide film is easily destroyed is obtained, so that good wettability can be held.

According to a second aspect of the present invention, there is provided an Sn—Zn lead-free solder alloy which is an Sn-based solder alloy indispensably containing 6 to 10 wt % zinc and 0.5 to 6 wt % bismuth at least and containing 0.0015 to 0.1 wt % magnesium, said magnesium content being effective quantity for forming a protective magnesium oxide film on the surface of solder and also for destroying said oxide film during soldering. Therefore, according to the present invention, in the case of the Sn—Zn lead-free solder containing bismuth, both of the good wettability and good preservation stability of the solder, described above, are also realized and, further, the unevenness of the solder surface is reduced upon solidification, so that the surface gloss can be further improved.

Further, according to a third aspect of the present invention, there is provided an Sn—Zn lead-free solder alloy mixture which is a mixture of two or more kinds of Sn-based solder alloys having different compositions and indispensably containing 0.0015 to 0.1 wt % magnesium, wherein the average composition of said mixture is within the composition range of the solder alloy according to the above described first aspect of the present invention.

According to a fourth aspect of the present invention, there is provided an Sn—Zn lead-free solder alllloy mixture which is a mixture of two or more kinds of Sn-based solder alloys having different compositions and indispensably containing 0.0015 to 0.1 wt % magnesium, wherein the average composition of said mixture is within the composition range of the solder alloy according to the above described second aspect of the present invention.

According to a fourth aspect of the present invention, there is provided a soldered bond which is bonded by the Sn—Zn lead-free solder alloy or its mixture according to the above described first, second, third or fourth aspects of the present invention.

BRIEF DESCRIPTION OF DRAWINGS

FIG. 1 is a table showing chemical compositions of solder particle and results of evaluation for characteristics in experiments of an Sn—Zn lead-free solder alloy of the present invention.

BEST MODE FOR CARRYING OUT THE INVENTION

An embodiment of the invention will be described further in detail hereinbelow with reference to the drawing.

In an Sn—Zn lead-free solder, as is well-known, for example, solder particle and a flux which have previously been prepared are stirred and mixed so as to obtain paste-like solder. In this case, however, zinc whose affinity with oxygen is large cannot help becoming an oxide on the surface of the solder particle. Therefore, if the solder particle is mixed with the flux so as to obtain solder paste, viscosity of the solder paste increases due to a reaction between zinc and an activator in the flux, so that a problem about preservation stability occurs. On the other hand, even if an activity or an amount of the activator is suppressed in order to prevent an increase in viscosity, a zinc oxide which is produced during soldering cannot be reduced, so that a deterioration of the wettability of the solder occurs.

Therefore, in the present invention, only an infinitesimal quantity of element whose oxidizing tendency is higher than that of zinc is added to the Sn—Zn solder, so that since the added element is oxidized preferentially to zinc, a protective film of the oxide of added element is formed on the surface of the solder particle, thereby the reaction between zinc and the flux being suppressed by the protective oxide film. By this method, it is intended to obtain the solder particle for the solder paste which is excellent in both of the wettability and the preservation stability. However, it has been found that the protective oxide film such as aluminum oxide film which is formed on the surface is too strong to be reduced by the flux, so that a large amount of unmelted solder occurs during soldering.

On the basis of the above-mentioned consideration of the above point, according to the present invention, magnesium is selected and used as an essential additional element among various elements whose oxidizing tendency is higher than that of zinc. The addition of magnesium has the following effects: it is possible to obtain the particle for the Sn—Zn solder paste in which both of the wettability and the preservation stability are excellent as mentioned above; and an amount of unmelted solder is small unlike other additional element such as aluminum or the like. In the present invention, a reason why the reaction between zinc and the flux is suppressed upon preservation of the solder paste and an amount of unmelted solder is small, is as follows. It is because while the protective film of the magnesium oxide which is formed on the surface of the solder particle protects the inside of the solder during preservation of it under refrigeration, at the elevated temperature during soldering, said protective oxide film is in a state where it is easily destroyed in order to hold the good wettability.

Therefore, according to the present invention, in order to suppress the reaction between zinc and the activator in the flux and improve the preservation stability during preservation of solder paste and, on the other hand, in order to hold good wettability during soldering, there is provided the Sn—Zn lead-free solder alloy constructed in a manner such that it is an Sn-based solder alloy indispensably containing 6 to 10 wt % zinc at least and containing 0.0015 to 0.1 wt % magnesium, said magnesium content being effective quantity for forming a protective magnesium oxide film on the surface of solder and also for destroying said oxide film during soldering.

Magnesium has the following other effects. That is, in the case of the Sn—Zn solder alloy containing bismuth, there is a tendency such that the metallic gloss on the surface of the solder becomes dim. However, it has been confirmed that if a small amount of magnesium is added to the Sn—Zn solder alloy containing bismuth, the surface gloss is improved. This is because if bismuth is added, the fine unevenness is formed on the surface upon solidification, but by adding magnesium, the unevenness on the solder surface is reduced upon solidification. Thus, the surface with good gloss close to that of the conventional Sn—Pb solder can be obtained.

Therefore, according to the present invention, the Sn—Zn lead-free solder alloy can be constructed in a manner such that it is an Sn-based solder alloy indispensably containing 6 to 10 wt % zinc and 0.5 to 6 wt % bismuth at least and containing 0.0015 to 0.1 wt % magnesium, said magnesium content being effective quantity for forming a protective magnesium oxide film on the surface of solder and also for destroying said oxide film during soldering.

Subsequently, reasons why the range of magnesium content is specified as mentioned above in the Sn—Zn lead-free solder alloy of the present invention will be described. First, a lower limit of magnesium content is set to 0.0015 wt % as a content necessary to obtain the effect of magnesium on the basis of results of experiments. This is because if it is less than 0.0015 wt %, the oxide film which is sufficient to reduce the reaction between zinc and flux is not formed on the particle surface.

An upper limit of magnesium content is set to 0.1 wt % in consideration of deterioration of solderability and manufacturing performance of the solder particle. This is because if it exceeds 0.1 wt %, the magnesium oxide is not destroyed but remains during soldering. Further, this is because viscosity of the molten metal which is used upon manufacturing of the solder particle rises. As mentioned above, only by specifying the upper and lower limits of the content of magnesium, the reaction between zinc and the flux is suppressed and the preservation stability is improved by the formed protective oxide film and, during soldering, the protective oxide film is destroyed and good wettability is assured.

According to the present invention, for example, in the case of manufacturing solder paste by mixing two or more kinds of solder particle having different compositions, since each solder particle before mixing contains 0.0015 to 0.1 wt % magnesium, the above effects can be obtained. However, in each solder particle before mixing, it is not always necessary that content of other element such as zinc or the like is within a range according to the above described first or second aspect of the present invention. It is sufficient that an average composition of the whole solder particle after mixing is within such a range.

Therefore, the Sn—Zn lead-free solder alloy mixture of the present invention can be also constructed by the mixture of two or more kinds of Sn-based solder alloys having different compositions and indispensably containing 0.0015 to 0.1 wt % magnesium, wherein the average composition of said mixture is within the composition range of the solder alloy according to the above described first aspect fo the present invention. The Sn—Zn lead-free solder alloy mixture of the present invention can be also constructed by the mixture of two or more kinds of Sn-based solder alloys having different compositions and indispensably containing 0.0015 to 0.1 wt % magnesium, wherein the average composition of said mixture is within the composition range of the solder alloy according to the above described second aspect of the present invention.

According to the present invention, the soldered bond of the Sn—Zn lead-free solder is formed by using the solder alloy or its mixture constructed as mentioned above.

Although the solder alloy and the solder alloy mixture adjusted by the foregoing chemical compositions have been described with respect to the example in which they have been processed to the solder particle in the above embodiment, naturally, they can be processed to wire solders and used as necessary.

EMBODIMENT

Although the present invention will be further specifically explained on the basis of the following embodiment, the present invention is not limited to this embodiment.

The present inventors made experiments in order to confirm the effects of the present invention. In the experiments of this embodiment, Sn-based solder particle in which a content of zinc is within a range of 6–9%, a content of bismuth is within a range of 0–3%, a content of magnesium is within a range of 0–0.1090% was used. The solder particle used in the experiments is powder of an Sn—Zn based alloy having spherical particle whose size is 32 to 45 mm in diameter. Chemical compositions of those particle and their characteristics evaluation results are shown in a table of FIG. 1. The solder particle is mixed with the flux so as to obtain a paste and used for various evaluation experiments. Solderability in FIG. 1 was measured by a method according to JIS-Z-3284 and wettability was evaluated. The experiments were performed by preheating at 150° C. for 0 to 3.5 minutes in the atmosphere in order to simulate conditions in a wider range. As results of the experiments, a paste in which wettability is defective is shown by "x", a paste in which it is good is shown by "o", and a paste in which it is very good is shown by "☉". With respect to the preservation stability, the solder particle and the flux are mixed, thereafter, the mixture is preserved for one week in a refrigerator held at about 4° C., and samples are evaluated on the basis of a degree of increase in viscosity and printability of resultant pastes. In a manner similar to the wettability, a defective paste is shown by "x", a good paste is shown by "o", and a very good paste is shown by "☉". As shown in FIG. 1, it has been confirmed that both of the wettability and the preservation stability of the pastes using the solder particle according to the present invention are excellent.

INDUSTRIAL APPLICABILITY

As mentioned above, among various solder materials, the solder materials according to the present invention are suitable for use in a mounting step of electronic circuit devices or the like, and particularly useful as an Sn—Zn lead-free solder alloy, its mixture, and a soldered bond which have improved environmental safety.

The invention claimed is:

1. A lead-free solder alloy consisting of the following components based on the total weight of the alloy:

6 to 10 wt. % of zinc (Zn);

0.5 to 6 wt. % of bismuth (Bi);

0.0015 to 0.1 wt. % of magnesium (Mg);

and the balance tin (Sn) to total 100 wt. % of the alloy; said magnesium content being an effective quantity for forming a protective magnesium oxide film on the surface of the solder and for destroying said oxide film during soldering.

2. A lead free solder alloy mixture which is a mixture of two or more kinds of Sn-based solder alloys having different compositions, each containing 0.0015 to 0.1 wt. % of magnesium (Mg) based on the total weight of the alloy, wherein the average composition of said mixture is within the composition range of the solder alloy according to claim 1.

3. A lead free soldered bond which is bonded by the solder alloy according to claim 1.

4. A lead free soldered bond which is bonded by the solder alloy mixture according to claim 2.

5. The lead free solder alloy of claim 1 wherein the percentage range of Mg is 0.0015 to 0.0533 wt. %.

* * * * *